United States Patent
Oyama et al.

(10) Patent No.: US 10,314,218 B2
(45) Date of Patent: Jun. 4, 2019

(54) COMPONENT MOUNTING MACHINE

(71) Applicant: FUJI CORPORATION, Chiryu (JP)

(72) Inventors: Shigeto Oyama, Kariya (JP); Jun Iisaka, Nisshin (JP)

(73) Assignee: FUJI CORPORATION, Chiryu (JP)

(*) Notice: Subject to any disclaimer, the term of this patent is extended or adjusted under 35 U.S.C. 154(b) by 64 days.

(21) Appl. No.: 15/300,095

(22) PCT Filed: Mar. 28, 2014

(86) PCT No.: PCT/JP2014/059102
§ 371 (c)(1),
(2) Date: Sep. 28, 2016

(87) PCT Pub. No.: WO2015/145720
PCT Pub. Date: Oct. 1, 2015

(65) Prior Publication Data
US 2017/0156242 A1    Jun. 1, 2017

(51) Int. Cl.
B23P 19/00 (2006.01)
H05K 13/04 (2006.01)
H05K 13/08 (2006.01)

(52) U.S. Cl.
CPC ......... *H05K 13/0404* (2013.01); *H05K 13/08* (2013.01); *H05K 13/0813* (2018.08); *H05K 13/0853* (2018.08)

(58) Field of Classification Search
None
See application file for complete search history.

(56) References Cited

U.S. PATENT DOCUMENTS 5,379,514 A * 1/1995 Okuda ............... H05K 13/0408
                                                          29/740
5,864,944 A * 2/1999 Kashiwagi ......... H05K 13/0413
                                                          29/712
(Continued)

FOREIGN PATENT DOCUMENTS

EP    1 617 717 A1   1/2006
JP    5-235598 A     9/1993
JP    7-221497 A     8/1995

OTHER PUBLICATIONS

Office Action dated Sep. 28, 2017 in Japanese Patent Application No. 2016-509819 (with unedited computer generated English translation).

(Continued)

*Primary Examiner* — Paul D Kim
(74) *Attorney, Agent, or Firm* — Oblon, McClelland, Maier & Neustadt, L.L.P.

(57) ABSTRACT

A component mounting machine including: a nozzle that picks up a component; sliders and a ball screw that move the nozzle in horizontal and vertical directions; a reel unit that supplies components; a board conveyance device that holds and conveys a board on which components are mounted; a parts camera that irradiates a component held by the nozzle with light to image the component from below; and a controller that performs various control functions, is provided. The controller obtains a clearance height at which an obstacle between the parts camera and a predetermined mounting position on a board can be avoided, extracts from an HDD an imageable range of the component, and sets a target height of a lower surface of the component held by the nozzle when the nozzle passes above the parts camera, such that the target height is closest to the clearance height within the imageable range.

8 Claims, 7 Drawing Sheets

(56) References Cited

U.S. PATENT DOCUMENTS

| | | | | |
|---|---|---|---|---|
| 6,441,386 B2* | 8/2002 | Sakaguchi | ............ | H05K 13/08 |
| | | | | 250/559.12 |
| 7,353,596 B2* | 4/2008 | Shida | ................ | H01L 21/67144 |
| | | | | 228/180.22 |
| 7,797,820 B2* | 9/2010 | Shida | ................ | H01L 21/67144 |
| | | | | 228/180.21 |
| 8,196,295 B2* | 6/2012 | Imafuku | ............ | H05K 13/0413 |
| | | | | 29/709 |
| 8,430,439 B2* | 4/2013 | Tsai | .................. | H05K 13/0408 |
| | | | | 29/743 |
| 2001/0030298 A1 | 10/2001 | Sakaguchi | | |
| 2006/0200973 A1 | 9/2006 | Imafuku et al. | | |
| 2007/0214629 A1 | 9/2007 | Imafuku et al. | | |
| 2016/0120081 A1* | 4/2016 | Hosaka | .................. | B05B 15/55 |
| | | | | 700/283 |

OTHER PUBLICATIONS

Extended European Search Report dated Oct. 16, 2017 in Patent Application No. 14887512.3.
International Search Report dated Jul. 1, 2014 in PCT/JP2014/059102 Filed Mar. 28, 2014.
Combined Office Action and Search Report dated Sep. 3, 2018 in Chinese Patent Application No. 201480077594.4, (with English translation of Office Action and English translation of categories of cited documents), 7 pages.

* cited by examiner

COMPONENT MOUNTING MACHINE

TECHNICAL FIELD

The present application relates to a component mounting machine.

BACKGROUND ART

In the related art, as a component mounting machine, there is known a component mounting machine in which a component supplied from a feeder is picked up on the tip of a nozzle, the nozzle is moved to above a camera and imaging of the component using the camera is performed, and thereafter, the nozzle is moved to above a board and the component is mounted at a predetermined position on the board. For example, in PTL 1, the nozzle is moved from the position of the feeder to the position of the camera in a state where the lower surface of the component held by the nozzle is lifted to a necessary minimum height (for example, 1 mm), and thereafter, the nozzle is lifted to a clearance height at which obstacles can be avoided during the movement of the nozzle from the position of the camera to the predetermined position on the board.

CITATION LIST

Patent Literature

PTL 1: JP-A-07-221497

SUMMARY

However, in PTL 1, since the distance between the lower surface of the component and the camera is fixed, a suitable image may not be obtained depending on the type of component. Additionally, although the nozzle is lifted from the necessary minimum height to the clearance height while the nozzle is moved from the position of the camera to the predetermined position on the board, the distance by which the nozzle is lifted is long, so there is a concern that the nozzle will hit an obstacle before the nozzle reaches the clearance height. In order to solve such a concern, moving the nozzle from the position of the camera to the predetermined position on the board after the nozzle has been lifted to the clearance height may be considered as a solution. However, since the distance, from the necessary minimum height to the clearance height, by which the nozzle is lifted is long there is a problem that the time required to lift the nozzle, thus the work time become long.

The present disclosure has been made in order to solve such a problem, and a main object thereof is to obtain an image suitable as a captured image of a component held by a nozzle and to shorten work time.

A component mounting machine of the disclosure is a component mounting machine including a head that holds a nozzle capable of picking up a component so as to be movable upward and downward; a moving device for moving the head in a horizontal direction; a component supply device for supplying the component; a board holding device for holding a board on which the component is mounted; an imaging device provided between the component supply device and the board holding device for irradiating the component held by the nozzle with light to image the component from below; a storage device for storing an imageable range of the imaging device according to the type of component; a setting device for obtaining a clearance height at which an obstacle between the imaging device and a predetermined mounting position on the board can be avoided, extracting the imageable range of a component to be mounted from the storage device, and setting a target height of the lower surface of the component held by the nozzle when the nozzle passes above the imaging device such that the target height is closest to the clearance height within the imageable range; and a control device for controlling the nozzle, the head, and the moving device such that a component supplied by the component supply device is picked up by the nozzle, the operation of lifting the nozzle such that the lower surface of the component held by the nozzle is located at the target height and the operation of moving the nozzle to the imaging device are made to be performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the mounting position.

In this component mounting machine, the target height of the lower surface of the component held by the nozzle when the nozzle passes above the imaging device is set so as to be closest to the clearance height (a height at which an obstacle between the imaging device and the predetermined mounting position on the board can be avoided) within the imageable range corresponding to the component. In addition, the "is closest" also includes a case where the target height is equal to the clearance height. Accordingly, the height of the lower surface of the component held by the nozzle when passing above the imaging device is closest to the clearance height within the imageable range. Therefore, a captured image of the component held by the nozzle is a suitable image. Additionally, after the end of the imaging, the lower surface of the component held by the nozzle is located at a height that is the same as or close to the clearance height. Therefore, when the lower surface of the component held by the nozzle is moved to the clearance height, the movement thereof in the vertical direction can be handled in a short time. When the target height is equal to or more than the clearance height, the component held by the nozzle may be moved onto the board at this height as is. In that case, the movement of the lower surface of the component in the vertical direction becomes unnecessary. Therefore, the lower surface of the component held by the nozzle can be located at a height such that the lower surface does not hit an obstacle, in a short time, thus work time can be shortened.

In the component mounting machine of the disclosure, the setting device may set a value obtained by adding a predetermined margin to the height of a component already mounted on the board as the clearance height. Then, the component held by the nozzle can be reliably prevented from interfering with the component already mounted on the board.

In the component mounting machine of the disclosure, the component supply device may include an adjustment mechanism capable of changing the height of the component supply device, and the control device may control the adjustment mechanism of the component supply device such that the height of the component supply device approaches the target height. In such a case, since a distance by which the nozzle is lifted from a position where the component is supplied to the target height becomes short, the time required for lifting the nozzle becomes short by the same amount.

Here, the control device may change the height of the component supply device such that the lower surface of the component held by the nozzle reaches the target height within a time during which the nozzle moves from the component supply device to the imaging device. Then, in a case where the operation of lifting the nozzle such that the lower surface of the component held by the nozzle is located at the target height, and the operation of moving the nozzle to the imaging device are performed in parallel, a situation where the operation of lifting the nozzle continues even though the nozzle has reached the position of the imaging device can be avoided.

In the component mounting machine of the disclosure, the height of the component supply device may be set such that the component reaches the target height within a time during which the nozzle moves from the component supply device to the imaging device. Then, even if there is no adjustment mechanism capable of changing the height of component supply device, the above-described situation can be avoided.

In the component mounting machine of the disclosure, the imaging device may include an adjustment mechanism capable of changing the height of this imaging device, and the control device may update the target height so as to approach the clearance height in a case where the target height does not coincide with the clearance height, and may control the adjustment mechanism of the imaging device such that a distance from the target height to the imaging device after the updating falls within an imageable range. Then, since a nozzle-lifting distance before a component is mounted on the predetermined mounting position on the board after the imaging using the imaging device ends becomes short, the time required for lifting the nozzle is shortened.

Here, the control device may update the target height so as to coincide with the clearance height. Then, it becomes unnecessary to lift the nozzle after the imaging using the imaging device until the component is mounted on the predetermined mounting position on the board.

In the component mounting machine of the disclosure, the head may hold multiple of the nozzles, the setting device may extract imageable ranges of respective components to be mounted from the storage device, may obtain an overlapping range of all the read imageable ranges, and may set the target height so as to be closest to the clearance height within the overlapping range, and the control device may control the nozzle, the head, and the moving device such that a component supplied by the component supply device is picked up by the nozzle, the operation of lifting the nozzle such that the lower surface of the component held by the nozzle is located at the target height and the operation of moving the nozzle to the imaging device are performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the mounting position.

In this case, the head holds multiple nozzles. The type of components held by the multiple nozzles is not necessarily the same. Therefore, an overlapping range of imageable ranges of the components is obtained, and the target height is set so as to be closest to the clearance height within the overlapping range. As a result, captured images of the components held by the respective nozzles are suitable images. Additionally, after the end of the imaging, the lower surfaces of the components held by the nozzles are at a height that is the same as or close to the clearance height. Therefore, even if the lower surfaces of the components held by the respective nozzles are moved to the clearance height, the movement thereof in the vertical direction can be handled in a short time. When the target height is equal to or more than the clearance height, the components held by the respective nozzles may be moved onto the board at this height as is. In that case, the movement of the lower surfaces of the components in the vertical direction becomes unnecessary. Therefore, the lower surfaces of the components held by the nozzles can be located at a height such that the lower surfaces do not hit an obstacle, in a short time, thus work time can be shortened.

DESCRIPTION OF EMBODIMENTS

Figure 1:
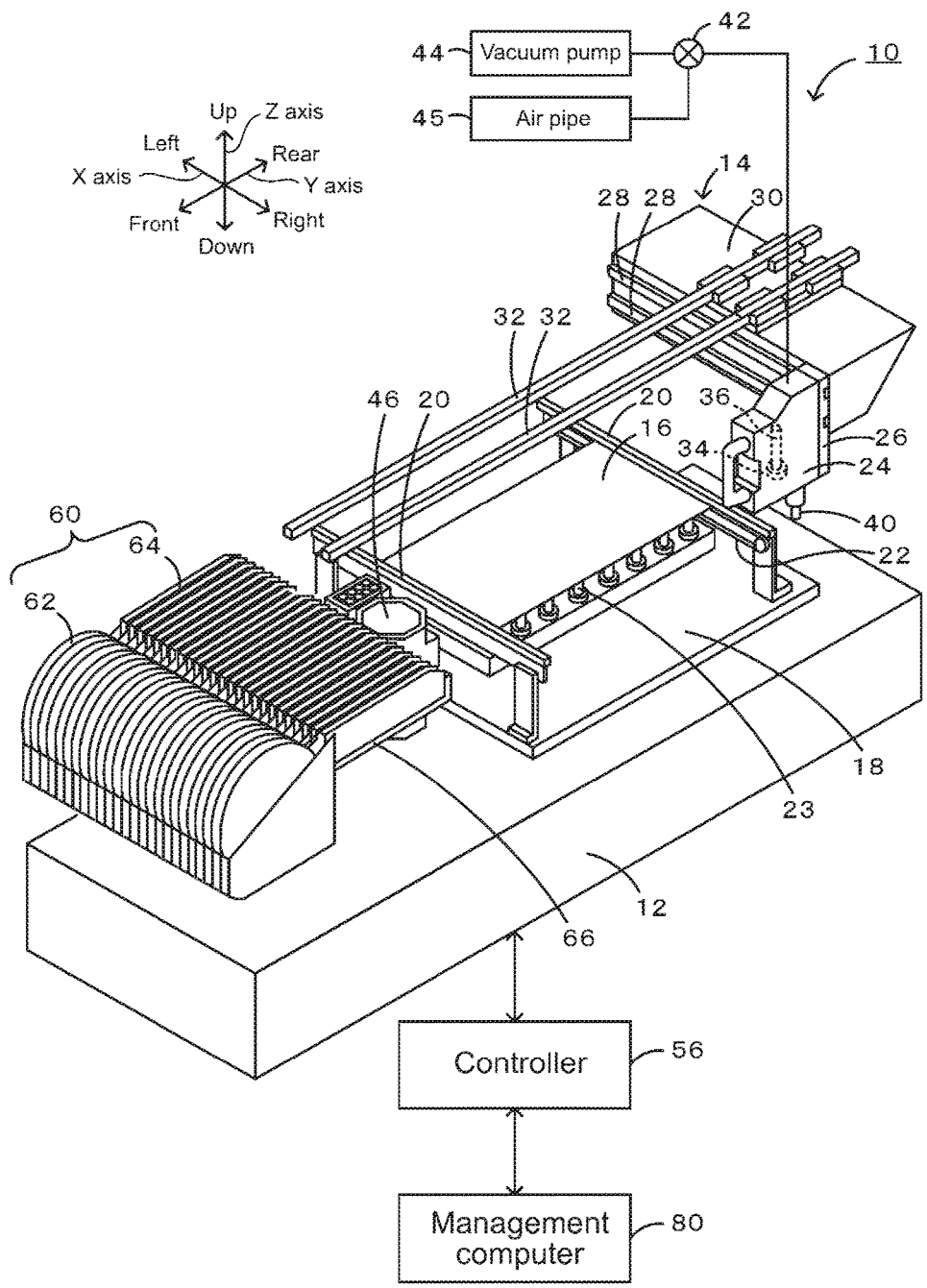
FIG. 1 is a perspective view of component mounting machine 10.
Figure 2:
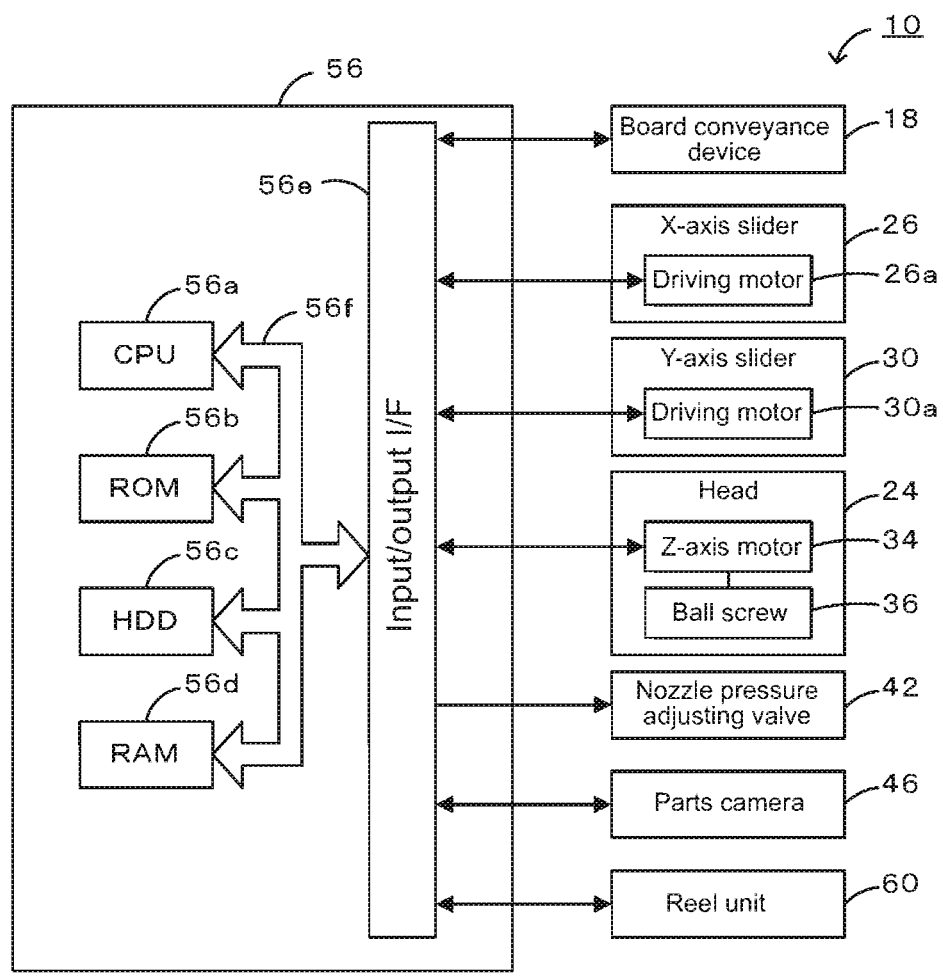
FIG. 2 is a block diagram illustrating a configuration related to the control of component mounting machine 10.

A suitable embodiment of the disclosure will be described below, referring to the drawings. FIG. 1 is a perspective view of component mounting machine 10, and FIG. 2 is a block diagram illustrating a configuration related to the control of component mounting machine 10. In addition, in the present embodiment, a leftward-rightward direction (X-axis), a forward-backward direction (Y-axis), and a vertical direction (Z-axis) are as illustrated in FIG. 1.

Component mounting machine 10 includes base 12, mounting machine main body 14 that is installed on base 12, and reel unit 60 serving as a component supply device that is mounted on mounting machine main body 14.

Base 12 is a heavy item formed into a rectangular parallelepiped, and has casters (not illustrated) on the bottom side in the four corners.

Mounting machine main body 14 is replaceably installed on base 12. Mounting machine main body 14 includes board conveyance device 18 that conveys or holds board 16, head 24 that is movable on an XY plane, nozzle 40 that is attached to head 24 and is movable along a Z-axis, parts camera 46 that images a component held by nozzle 40, and controller 56 that executes various kinds of control.

Board conveyance device 18 includes supporting plates 20 and 20 that are provided at a distance from each other in the forward-backward direction in FIG. 1 and extend in the leftward-rightward direction, and conveyor belts 22 and 22 (only one conveyor belt is illustrated in FIG. 1) that are provided on mutually facing surfaces of both the supporting plates 20 and 20. The conveyor belts 22 and 22 are mounted on a driving wheel and a driven wheel that are provided on the left and right of the supporting plates 20 and 20. Board 16 is put on upper surfaces of the pair of conveyor belts 22 and 22 and is conveyed from the left to the right. Board 16 is supported by multiple supporting pins 23 that are erected under the board.

Head 24 is attached to a front surface of X-axis slider 26. X-axis slider 26 is attached to a front surface of Y-axis slider 30 that is slidable in the forward-backward direction so as to be slidable in the leftward-rightward direction. Y-axis slider 30 is slidably attached to a pair of left and right guide rails 32 and 32 that extends in the forward-backward direction. A pair of upper and lower guide rails 28 and 28 that extends in the leftward-rightward direction is provided on the front surface of Y-axis slider 30, and X-axis slider 26 is slidably attached to guide rails 28 and 28 in the leftward-rightward direction. Head 24 moves in the leftward-rightward direction with X-axis slider 26 moving in the leftward-rightward direction, and moves in the forward-backward direction with Y-axis slider 30 moving in the forward-backward direction. In addition, the respective sliders 26 and 30 are driven by driving motors 26a and 30a (refer to FIG. 2), respectively. Additionally, head 24 has a Z-axis motor 34 built therein, and adjusts the height of the nozzle 40, which is attached to a ball screw 36 extending along the Z-axis, using Z-axis motor 34.

The nozzle 40 is formed in a shape such that a component can be picked up by the tip of the nozzle. Vacuum pump 44 and air pipe 45 are connected to nozzle 40 via nozzle pressure adjusting valve 42 that is an electromagnetic valve. In order to pick up a component on the tip of nozzle 40, nozzle pressure adjusting valve 42 is operated such that negative pressure from vacuum pump 44 is supplied to the tip of nozzle 40. On the other hand, in order to remove the component from the tip of nozzle 40, nozzle pressure adjusting valve 42 is operated such that positive pressure from air pipe 45 is supplied to the tip of nozzle 40.

Figure 4:
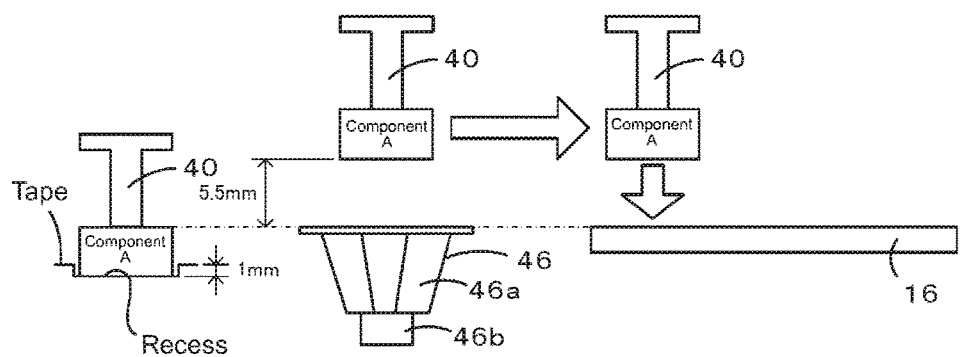
FIG. 4 is an explanatory view illustrating an aspect in which a component is mounted on board 16.

Parts camera 46 is arranged in front of supporting plate 20 on the front side of board conveyance device 18. The imaging range of parts camera 46 is above parts camera 46. Additionally, parts camera 46, as illustrated in FIG. 4, includes lighting section 46a in which multiple LEDs are attached to an inner surface of an inverted octagonal truncated pyramidal housing of which upper and lower surfaces are open, and camera main body 46b arranged under the housing. When a nozzle 40 holding a component passes above parts camera 46, parts camera 46 irradiates the component held by the nozzle 40 with LED light to image the component, and outputs the obtained captured image to controller 56.

Controller 56, as illustrated in FIG. 2, is constituted from a microprocessor centered on CPU 56a, and includes ROM 56b that stores a processing program, HDD 56c that stores various kinds of data, RAM 56d that is used as working memory, input and output interface 56e for performing exchange of electrical signals with an external device, and the like, which are connected together via bus 56f. Controller 56 outputs drive signals to board conveyance device 18 and driving motor 26a of X-axis slider 26, driving motor 30a of Y-axis slider 30, and nozzle pressure adjusting valve 42, and inputs image signals from parts camera 46. Additionally, controller 56 compares the captured image obtained from parts camera 46 with an image of a component in a normally held state stored in advance, thereby determining whether a component held by nozzle 40 is in a normal posture, determining the presence/absence of the component, or the like. In addition, although not illustrated, each of sliders 26 and 30 is equipped with a position sensor (not illustrated), and controller 56 controls driving motors 26a and 30a of the respective sliders 26 and 30, inputting positional information from the position sensors.

Reel unit 60 includes multiple reels 62, and is detachably attached to the front side of mounting machine main body 14. A tape is wound around each reel 62, and components are held along a longitudinal direction on the surface of the tape. The components are protected by a film that covers the surface of the tape. Such a tape is unwound backward from the reel, and the film is removed in a feeder section 64 so as to expose the components. Feeder section 64 is clamped by device pallet 66. Device pallet 66 plays the role of supporting feeder section 64 from below.

Next, an outline of operation of component mounting machine 10 will be described. Controller 56 receives a command from management computer 80 that manages a production job, and starts a component mounting processing routine. In component mounting machine 10, the production job determines on which board 16 which components are to be mounted in what order and determines on how many boards 16 mounting of components is to be performed. First, controller 56 rotationally drives reel 62 of reel unit 60 to unwind the tape wound around reel 62 backwards, and exposes a component in the surface of the tape in the feeder section 64. Subsequently, controller 56 controls X-axis slider 26 and Y-axis slider 30 such that nozzle 40 comes immediately above the exposed component. Subsequently, controller 56 controls Z-axis motor 34 to lower nozzle 40, using ball screw 36, and controls nozzle pressure adjusting valve 42 such that negative pressure is supplied to the tip of nozzle 40. Accordingly, the component is picked up on the tip of nozzle 40. Thereafter, controller 56 lifts nozzle 40, and controls the respective sliders 26 and 30 such that the component held on the tip of nozzle 40 comes immediately above a predetermined mounting position of board 16 via above parts camera 46. Then, controller 56 supplies positive pressure to the tip of nozzle 40 while lowering nozzle 40 at that position. Then, the component is separated from nozzle 40 and the component is mounted at the predetermined mounting position of board 16. In addition, controller 56 performs correction based on the amount of correction calculated from the captured image of parts camera 46, with respect to the mounting position where the component is to be mounted.

Figure 3:
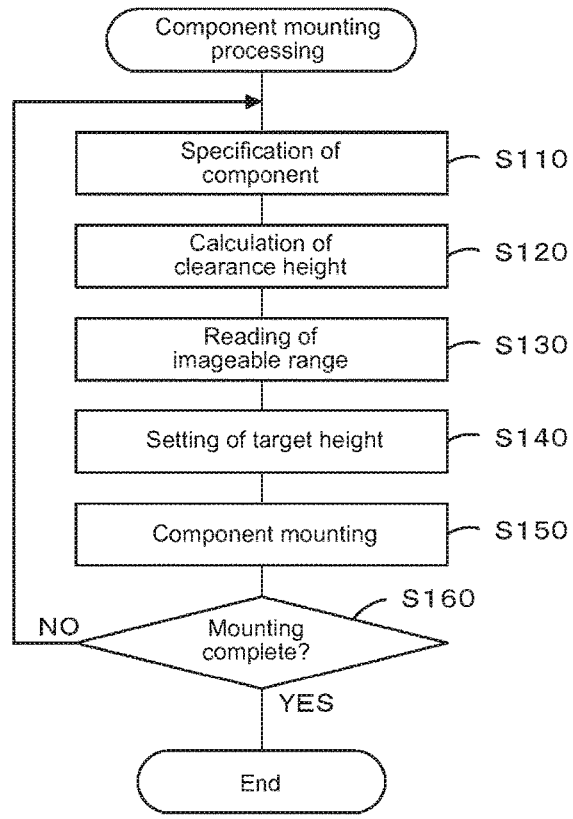
FIG. 3 is a flowchart of a component mounting processing routine.

Next, details of operation of component mounting machine 10 will be described according to the flowchart of the component mounting processing routine of FIG. 3.

When CPU 56a of controller 56 starts the component mounting processing routine, first, the CPU specifies a component to be mounted (Step S110). The specification of the component is performed on the basis of the production job from the management computer. Here, a case where firstly a component A, secondly a component B, thirdly a component B, and fourthly a component A are mounted on the board 16 will be described as an example. A relationship between imageable ranges for the types of components and the heights of the components is illustrated in Table 1. Here, the imageable ranges mean the ranges of heights from a reference position (the upper surface of board 16). In the present embodiment, the upper surface of board 16, an upper surface of parts camera 46, and upper surfaces of components supplied from reel unit 60 have the same height (refer to FIG. 4). Controller 56 determines suitability, such as whether the component held by the nozzle 40 is in a normal posture, or whether a portion of the component is missing, on the basis of the image captured by parts camera 46. The accuracy of determination of the suitability depends on the image captured by parts camera 46. For example, in order to determine the presence/absence of bumps on an IC chip component having multiple bumps formed on the lower surface thereof, it is necessary to irradiate the bumps with lateral light as much as possible such that the bumps come out white. Therefore, the imageable ranges are set to be narrow. Meanwhile, determining whether a package component having multiple leads protruding sideways from a side surface thereof is held in a normal posture just requires irradiation of the package component with light from below. Therefore, the imageable ranges are set to be wide. Here, component A corresponds to the former and component B corresponds to the latter. As illustrated in Table 1, the imageable range of the component A, both a lower limit and an upper limit are set to 5.5 mm, that is, one point of 5.5 mm. On the other hand, the imageable range of the component B has a lower limit of 5.5 mm and an upper limit of 15.5 mm, and is a relatively wide range. The correspondence relationship as shown in Table 1 is stored in HDD 56c of controller 56.

TABLE 1

| Type of Component | Imageable Range | | Height of Component [mm] |
| --- | --- | --- | --- |
| | Lower Limit [mm] | Upper Limit [mm] | |
| Component A | 5.5 | 5.5 | 4 |
| Component B | 5.5 | 15.5 | 7 |

Subsequently, CPU 56a calculates the clearance height of a component to be mounted (Step S120). The clearance height is a height capable of avoiding an obstacle between parts camera 46 and a predetermined mounting position (a position where the current component is to be mounted) of board 16, and the height is a height from the reference position. Here, a value obtained by adding a margin (here, set to 1 mm) to the height of the tallest component among components already mounted on the board 16 is set to the clearance height.

Subsequently, CPU 56a reads the imageable range of a component to be mounted (Step S130). For example, in a case where the type of the component to be mounted is a component A, an imageable range corresponding to the component A is read from Table 1 stored in HDD 56c, and in a case where the type of the component to be mounted is a component B, an imageable range corresponding to the component B is read.

Subsequently, CPU 56a sets the height (target height) of the lower surface of the component held by nozzle 40 when the nozzle 40 passes above parts camera 46 (Step S140). For example, in a case where the type of component to be mounted is a component A, both the lower limit and the upper limit of the imageable range of the component A are 5.5 mm, that is, one point. Therefore, a value closest to the clearance height within the imageable range is always set to 5.5 mm. Therefore, CPU 56a always sets the target height from the reference position to the lower surface of the component held by nozzle 40 to 5.5 mm. For example, in a case where the type of the component to be mounted is a component B, the imageable range of the component B is 5.5 mm to 15. 5 mm. Therefore, a value closest to the clearance height within the imageable range varies according to the clearance height. Therefore, CPU 56a always sets the target height from the reference position to the lower surface of the component held by the nozzle 40 according to the clearance height. That is, in a case where the clearance height is less than 5.5 mm, the target height is set to 5.5 mm, in a case where the clearance height is 5.5 mm or more to 15.5 mm or less, the target height is set to the same value as the clearance height, and in a case where the clearance height is more than 15.5 mm, the target height is set to 15.5 mm.

Subsequently, CPU 56a performs mounting of a component (Step S150). That is, first, CPU 56a moves nozzle 40 to above a component supply position of feeder section 64 of reel unit 60, and picks up a component supplied by reel unit 60 using nozzle 40. Next, CPU 56a moves the nozzle 40 to above parts camera 46, lifting the nozzle 40 such that the lower surface of the component held by the nozzle 40 reaches a target height. CPU 56a makes parts camera 46 image the component held by the nozzle 40 when the component has come immediately above parts camera 46. Thereafter, CPU 56a makes the lower surface of the component held by the nozzle 40 reach the clearance height, and moves the nozzle 40 to a predetermined mounting position of board 16, to mount the component at this predetermined mounting position. In addition, in a case where the target height is equal to or more than the clearance height, the nozzle 40 may be moved to the predetermined mounting position of board 16, with the lower surface of the component held by the nozzle 40 being located at the target height, or the nozzle 40 may be moved to the predetermined mounting position of board 16 after being lowered (while being lowered) to the clearance height from the target height.

Thereafter, CPU 56a determines whether mounting of all components onto board 16 has been completed (Step S160). In a case where the mounting of all the components is not completed, the processing returns back to Step S110 and mounting of the remaining components is performed. On the other hand, in a case where the mounting of all the components is completed in Step S160, CPU 56a ends this component mounting processing routine.

Next, an aspect in which component mounting machine 10 mounts components on board 16 will be described, referring to FIGS. 4 to 7.

FIG. 4 is an explanatory view in a case where a component A is to be mounted on board 16, where no components have been mounted on board 16 yet. Since no components have been mounted on board 16, the clearance height has a value obtained by adding 1 mm in margin to zero, that is, 1 mm. Since both the lower limit and the upper limit of the imageable range of the component A are 5.5 mm and the clearance height is 1 mm, the target height of the lower surface of the component A held by the nozzle 40 is set to 5.5 mm. CPU 56a causes nozzle 40 to pick up a component A supplied by reel unit 60, and makes the nozzle 40 move to above parts camera 46 while lifting the nozzle 40 such that the lower surface of the component A held by the nozzle 40 reaches 5.5 mm, which is the target height. Since the component A is contained in a recess (for example, with a depth of 1 mm) of the tape, the component need to be moved to above parts camera 46 after being lifted immediately above by at least the depth of the recess. When component A held by the nozzle 40 is directly above parts camera 46, imaging of the component A using parts camera 46 is performed. Thereafter, CPU 56a moves the nozzle 40 to the predetermined mounting position (the left end of the board 16 in FIG. 4) of board 16 to mount the component at this mounting position, with the height of the lower surface of the component A held by the nozzle 40 being the target height. In this case, after the height of the lower surface of the component held by the nozzle 40 is lowered to the clearance height (or while being lowered), the nozzle 40 may be moved to the predetermined mounting position of board 16 from above parts camera 46.

Figure 5:
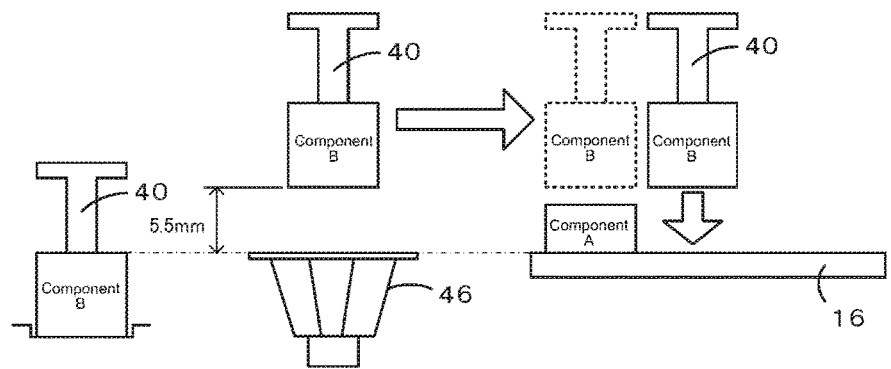
FIG. 5 is an explanatory view illustrating an aspect in which a component is mounted on board 16.

FIG. 5 is an explanatory view in a case where a component B is mounted adjacent to the right of component A on board 16 after component A has been mounted on the left end of the board 16. In this case, the clearance height becomes a value obtained by adding 1 mm in margin to 4 mm, which is the height of component A, that is, 5 mm. Since the imageable range of component B is 5.5 mm to 15.5 mm and the clearance height is 5 mm, the target height of the lower surface of component B held by nozzle 40 is set to 5.5 mm. CPU 56a causes nozzle 40 to pick up the component B supplied by reel unit 60, and makes the nozzle 40 move to above parts camera 46 while lifting the nozzle 40 such that the lower surface of the component B held by the nozzle 40 reaches 5.5 mm, which is the target height. Since the component B is also contained in a recess (for example, a depth of 1 mm) of the tape, the component need to be moved to above parts camera 46 after being lifted straight up by at least the depth of the recess. When the component B held by the nozzle 40 is directly above parts camera 46, imaging of the component B using parts camera 46 is performed. Thereafter, CPU 56a makes the nozzle 40 move to the predetermined mounting position (a position adjacent to the right of the component A on board 16 in FIG. 5) of board 16 to mount the component on this mounting position, with the height of the lower surface of the component B held by the nozzle 40 being the target height. In this case, after the height of the lower surface of the component held by the nozzle 40 is lowered to the clearance height (or while being lowered), the nozzle 40 may be moved to the predetermined mounting position of board 16 from above parts camera 46.

Figure 6:
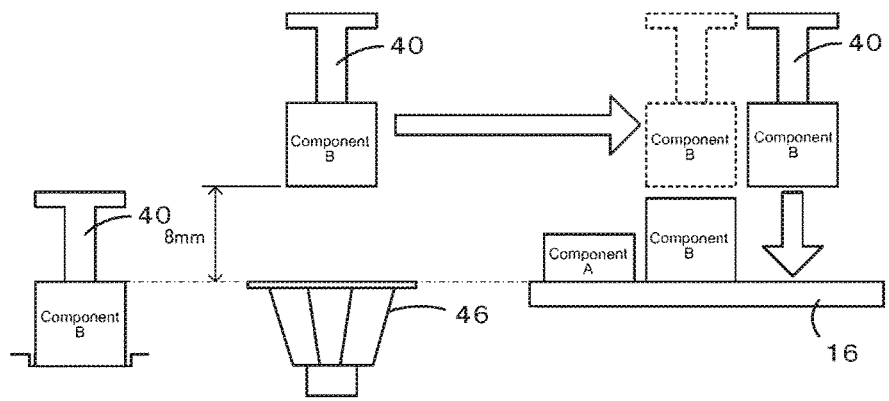
FIG. 6 is an explanatory view illustrating an aspect in which a component is mounted on board 16.

FIG. 6 is an explanatory view in a case where another component B is mounted adjacent to the right of the component B on board 16 after component A and component B have been mounted sequentially from the left end of board 16. In this case, the clearance height becomes a value obtained by adding 1 mm in margin to 7 mm, which is the height of the tallest component, which is component B, that is, 8 mm. Since the imageable range of the component B is 5.5 mm to 15.5 mm and the clearance height is 8 mm, the target height of the lower surface of the component B held by the nozzle 40 is set to 8 mm. CPU 56a causes nozzle 40 to pick up the component B supplied by reel unit 60, and makes the nozzle 40 move to above parts camera 46 while lifting the nozzle 40 such that the lower surface of the component B held by the nozzle 40 reaches 8 mm, which is the target height. When the component B held by the nozzle 40 is directly above parts camera 46, imaging of the component B using parts camera 46 is performed. Thereafter, CPU 56a makes the nozzle 40 move to the predetermined mounting position (a position adjacent to the right of the component B on board 16 in FIG. 6) of board 16 to mount the component on this mounting position, with the lower surface of the component B held by the nozzle 40 being located at the target height.

Figure 7:
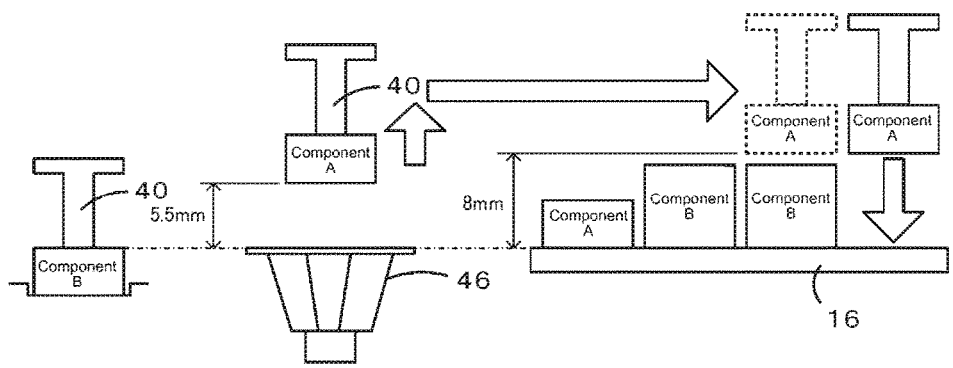
FIG. 7 is an explanatory view illustrating an aspect in which a component is mounted on board 16.

FIG. 7 is an explanatory view in a case where another component A is mounted adjacent to the right of the right-handed component B on the board 16 after the component A, the component B, and the other component B have been mounted sequentially from the left end of board 16. In this case, the clearance height becomes a value obtained by adding 1 mm in margin to 7 mm, which is the height of the tallest component, component B, that is, 8 mm. Since the imageable range of the component A is 5.5 mm (one point) and the clearance height is 8 mm, the target height of the lower surface of the component A held by the nozzle 40 is set to 5.5 mm. CPU 56a causes nozzle 40 to pick up the component A supplied by reel unit 60, and makes the nozzle 40 move to above parts camera 46 while lifting the nozzle 40 such that the lower surface of the component A held by the nozzle 40 reaches 5.5 mm, which is the target height. When the component A held by the nozzle 40 is directly above parts camera 46, imaging of the component A using parts camera 46 is performed. Thereafter, CPU 56a makes the nozzle 40 move to the predetermined mounting position (a position adjacent to the right of the right-handed component B on board 16 in FIG. 7) of board 16 to mount the component on this mounting position, after the lower surface of the component A held by the nozzle 40 is lifted to the clearance height.

Here, the corresponding relationships between the constituent elements of the present embodiment and the constituent elements of the disclosure will be clarified. Nozzle 40 of the present embodiment is equivalent to a nozzle of the disclosure, head 24 is equivalent to a head, X-axis slider 26 and Y-axis slider 30 are equivalent to a moving device, reel unit 60 is equivalent to a component supply device, board conveyance device 18 is equivalent to a board holding device, parts camera 46 is equivalent to an imaging device, HDD 56c of controller 56 is equivalent to a storage device, and CPU 56a is equivalent to a setting device and a control device.

According to component mounting machine 10 described above, the target height of the lower surface of a component held by nozzle 40 when the nozzle 40 passes above parts camera 46 is set so as to be closest to a clearance height within an imageable range corresponding to the component. Accordingly, the height of the lower surface of the component held by the nozzle 40 when passing above parts camera 46 is closest to the clearance height within the imageable range. Therefore, a captured image of the component held by the nozzle 40 is an image that is suitable to determine the suitability of the component, or the like.

Additionally, after the imaging, the lower surface of the component held by the nozzle 40 is located at a height that is the same as or close to the clearance height. Therefore, if the lower surface of the component held by the nozzle 40 is then moved to the clearance height, the movement thereof in the vertical direction can be handled in a short time. When the target height is equal to or more than the clearance height, the component held by the nozzle 40 may be moved above board 16 at this height as is. In that case, the movement of the lower surface of the component in the vertical direction becomes unnecessary. In any case, the lower surface of the component held by the nozzle 40 can be located at a height such that the lower surface does not hit an obstacle, in a short time, thus work time can be shortened.

Moreover, since controller 56 adopts a value obtained by adding a predetermined margin to the height of a component already mounted on board 16 as the clearance height, the component held by the nozzle 40 can be reliably prevented from interfering with the component already mounted on board 16.

In addition, it is needless to say that the disclosure is not limited to the above-described embodiment, and can be carried out in various aspects that belong to the technical scope of the disclosure.

Figure 8:
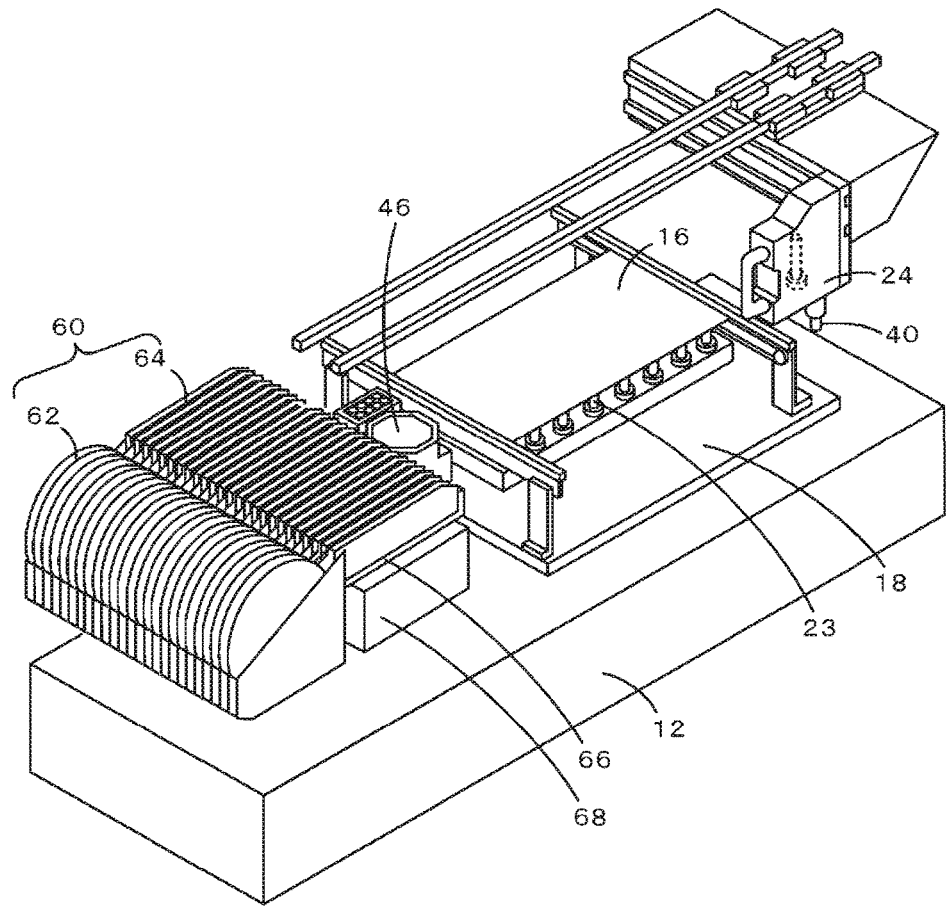
FIG. 8 is a perspective view of the component mounting machine including height adjustment mechanism 68.
Figure 9:
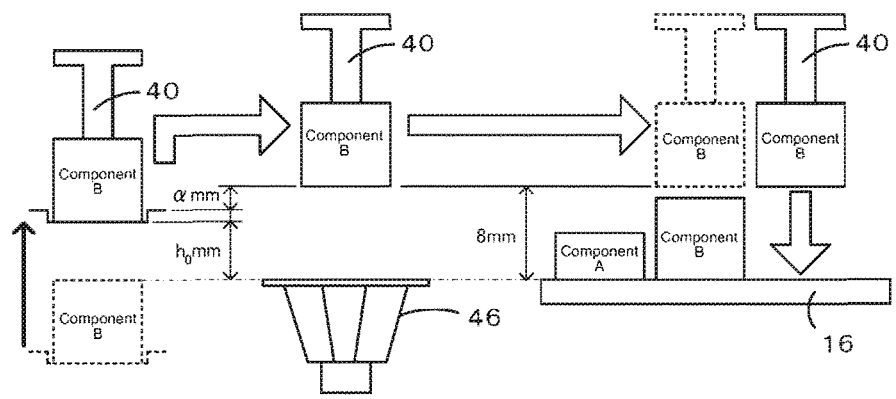
FIG. 9 is an explanatory view illustrating an aspect in which a component is mounted on board 16.

For example, in the above-described embodiment, as illustrated in FIG. 8, height adjustment mechanism 68 may be provided below device pallet 66 of reel unit 60, and the height of the component supplied by reel unit 60 may be changed to above the reference position (the upper surface of board 16) by height adjustment mechanism 68 moving device pallet 66 in the vertical direction with respect to base 12. Height adjustment mechanism 68 is electrically connected to controller 56, and is operated according to command signals from controller 56. In this case, in the component mounting processing routine of FIG. 3, after the target height is set in Step S140, CPU 56a controls height adjustment mechanism 68 such that the height of the component supplied by reel unit 60 approaches the target height, and then, proceeds to Step S150. Since the component is contained in a recess provided in the tape, it is necessary to lift the component by the height of the recess. Therefore, height adjustment mechanism 68 is controlled such that the height of the lower surface of the component supplied by reel unit 60 has a value h0 (that is, h0=Target height−(Height of Recess+α)) obtained by subtracting height+α (α is 1 mm to 2 mm) of the recess from the target height. Then, as illustrated in FIG. 9, since the lower surface of the component supplied by reel unit 60 is lifted in advance to the height of the value h0, the time required for lifting the nozzle become short by the same amount, thus work time is shortened.

Otherwise, in a case where the operation of lifting the nozzle 40 such that the lower surface of the component held by the nozzle 40 is located at the target height, and the operation of moving the nozzle 40 to parts camera 46 are performed in parallel, these operations may be performed as follows. That is, the height of the lower surface of the component supplied by reel unit 60 may set to a height such that the lower surface of the component held by the nozzle 40 reaches the target height within a time that is required in order for the nozzle 40 to horizontally move from the component supply position of reel unit 60 to above parts camera 46. Then, a situation where the operation of lifting the nozzle 40 continues even though the nozzle 40 has reached the position of parts camera 40 can be avoided.

In the above-described embodiment, the upper surface of the component supplied by reel unit 60 is made to coincide with the upper surface of board 16. However, the upper surface of the component supplied by reel unit 60 may be set so as to become higher than the upper surface of board 16. For example, the height of the lower surface of the component supplied by reel unit 60 may set to a height such that the lower surface of the component held by the nozzle 40 reaches the target height within a time during which the nozzle 40 horizontally moves from the component supply position of reel unit 60 to above parts camera 46. Then, even if height adjustment mechanism 68 illustrated in FIG. 8 is not provided, a situation where the operation of lifting the nozzle 40 continues even though the nozzle 40 has reached the position of parts camera 40 can be avoided.

In the above-described embodiment, reel unit 60 is illustrated as the component supply device. However, the component supply device is not particularly limited to reel unit 60. For example, a well-known tray unit (for example, refer to JP-A-2011-060816) may be adopted instead of reel unit 60, a pallet on which the tray is placed may be pulled out from a magazine and may be moved to a predetermined component supply position by a pallet pull-out table such that a component is picked up by a nozzle at the component supply position. In this case, a height adjustment mechanism may be provided below the pallet pull-out table of the tray unit. Then, since the height of a component supplied by the tray unit can be appropriately adjusted similar to FIG. 9, the time required for lifting the nozzle becomes short, thus work time is shortened.

Figure 10:
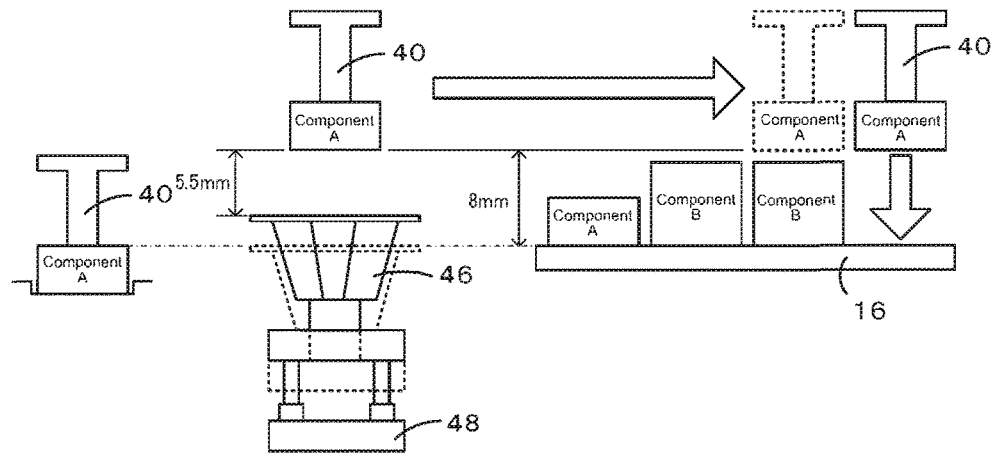
FIG. 10 is an explanatory view illustrating an aspect in which a component is mounted on board 16.

In the above-described embodiment, the height of parts camera 46 is fixed. However, as illustrated in FIG. 10, height adjustment mechanism 48 may be provided below parts camera 46, and the height of the upper surface of parts camera 46 may be changed to above the reference position. Height adjustment mechanism 48 is electrically connected to controller 56, and is operated according to command signals from controller 56. In this case, in the component mounting processing routine of FIG. 3, after the target height is set in Step S140, CPU 56a determines whether the target height coincides with the clearance height, and if the target height coincides with the clearance height, the CPU proceeds to Step S150. On the other hand, if the target height does not coincide with the clearance height, CPU 56a updates the target height so as to coincide with the clearance height, controls height adjustment mechanism 48 of parts camera 46 such that the distance from the target height after the updating to the upper surface of parts camera 46 falls within an imageable range, and then proceeds to Step S150. Then, as illustrated in FIG. 10, it becomes unnecessary to lift the nozzle 40 after the imaging using parts camera 46 ends. In addition, in a case where the target height does not coincide with the clearance height, the target height may be updated so as to approach the clearance height. Even in such a case, since a distance by which the nozzle 40 is lifted after the imaging using parts camera 46 ends becomes short, the time required for lifting the nozzle is shortened by the same amount. In addition, in a case where the direction of light to be radiated to a component is important, only lighting section 46a may be moved in the vertical direction by the height adjustment mechanism, with camera main body 46b (refer to FIG. 4) of parts camera 46 being fixed.

In the above-described embodiment, a user may specify an imageable range for every component. In this case too, after the specification by the user, an imageable range is matched with the type of a component, and is first stored in a storage device (for example, HDD 56c) of controller 56. Therefore, the component mounting processing routine is carried out similar to the above-described embodiment.

In the above-described embodiment, the clearance height is calculated as the value obtained by adding a margin to the height of the tallest component among components already mounted on board 16. However, the disclosure is not particularly limited to this. For example, in a case where an obstacle taller than a component already mounted between the component supply position of reel unit 60 and the component mounting position of board 16 is present, a value obtained by adding a margin to the height of the obstacle may be adopted as the clearance height.

In the above-described embodiment, the nozzle 40 is moved to above parts camera 46 while being lifted to the target height after the component supplied by reel unit 60 has been picked up by the nozzle 40. However, the nozzle 40 may be moved to above parts camera 46 after being lifted to the target height.

Figure 11:
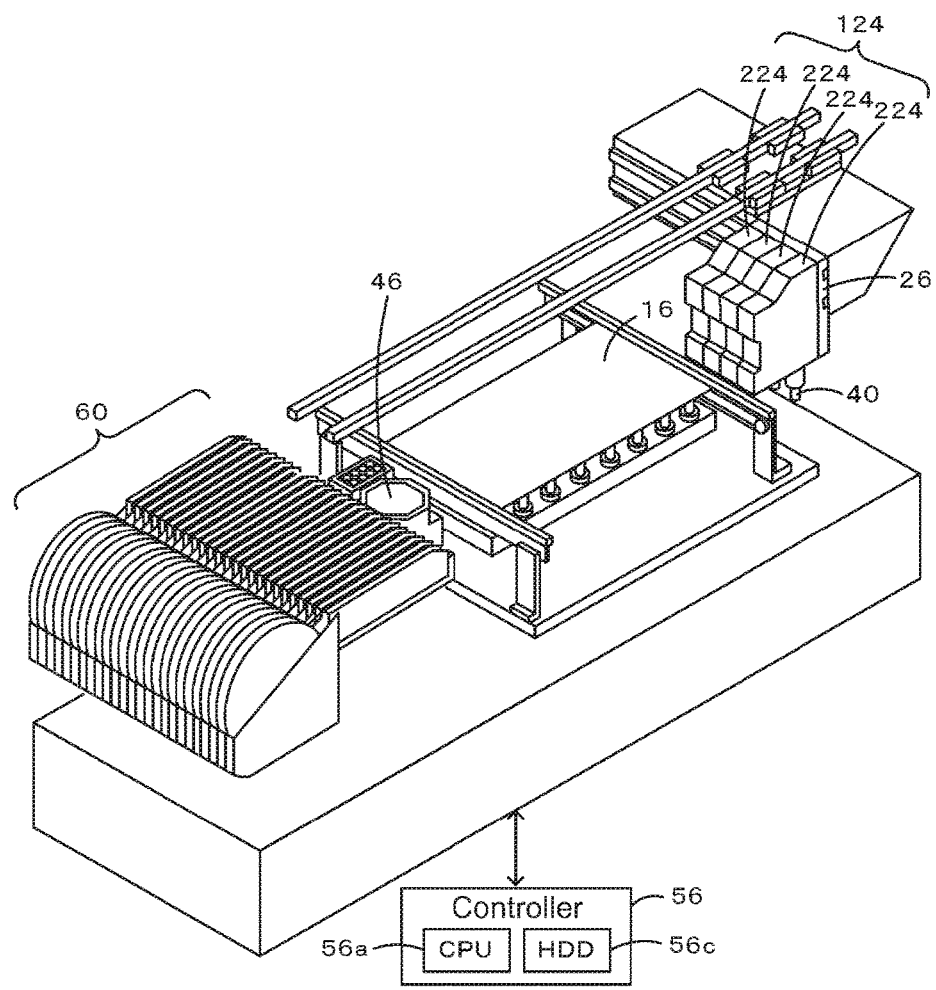
FIG. 11 is a perspective view of a component mounting machine including large-sized head 124.
Figure 12:
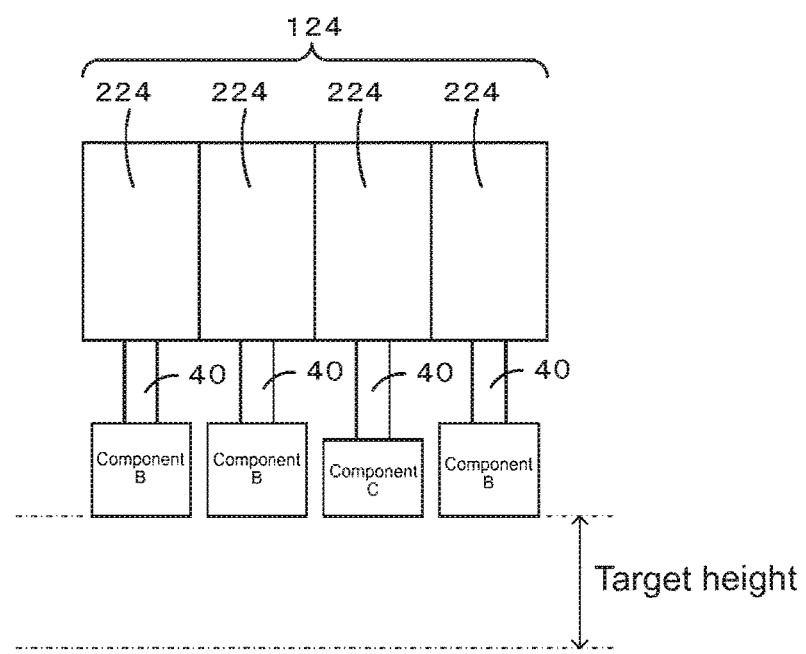
FIG. 12 is an explanatory view of large-sized head 124.

Component mounting machine 10 of the above-described embodiment may be mounted with large-sized head 124, which holds multiple nozzles 40 to be movable upward and downward, on X-axis slider 26, as illustrated in FIG. 11, instead of head 24. Large-sized head 124 is an assembly of multiple (four in FIG. 11) unit heads 224. Therefore, large-sized head 124 holds multiple nozzles 40 so as to be individually movable upward and downward. In a case where such a large-sized head 124 is adopted, CPU 56a of controller 56 specifies components to be mounted, that is, components to be mounted on the respective nozzles 40, in Step S110 of the component mounting processing routine (refer to FIG. 3). Subsequently, CPU 56a reads the imageable ranges of the respective components that are previously specified in Step S130 from HDD 56c, after the clearance height is calculated in Step S120. Subsequently, in setting the target height in Step S140, CPU 56a obtains an overlapping range of all the imageable ranges, and sets the target height so as to be closest to the clearance height within the overlapping range. For example, in a case where the specified components are a component B (a component of which the imageable range is 5.5 mm to 15.5 mm, refer to Table 1) and a component C (a component in which the imageable range is 7.5 mm to 17.5 mm), the overlapping range is 7.5 mm to 15.5 mm. Then, supposing that the clearance height is 8 mm, the target height is set to a value closest to the clearance height, that is, 8 mm, which is within the overlapping range; supposing that the clearance height is 5 mm, the target height is set to 7.5 mm; and supposing that the clearance height is 16 mm, the target height is set to 15.5 mm. Thereafter, the CPU 56a performs mounting a component in Step S150. CPU 56a first causes the multiple nozzles 40 to respectively pick up components supplied by reel unit 60. Next, CPU 56a lifts the nozzles 40 such that all lower surfaces of the components held by the respective nozzles 40 reach the target height and moves large-sized head 124 to above parts camera 46. FIG. 12 illustrates an example in a case where components B are held by three of four nozzles 40 held by large-sized head 124 and a component C is held by one nozzle. All the heights of lower surfaces of the respective components become the target height. CPU 56a makes parts camera 46 image the components held by the respective nozzles 40 whenever the components are directly above parts camera 46. Thereafter, CPU 56a makes all the lower surfaces of the components held by the respective nozzles 40 reach the clearance height, and moves the nozzles 40 to predetermined mounting positions of board 16 determined for the respective components, to mount the components on the predetermined mounting positions. In addition, in a case where the target height is equal to or more than the clearance height, the nozzles 40 may be moved to the predetermined mounting positions of board 16, with the lower surfaces of the components held by the nozzles 40 being located at the target height, or the nozzles 40 may be moved to the predetermined mounting positions of board 16 after being lowered (while being lowered) to the clearance height from the target height. Even if the disclosure is configured as above, the same effects as the above-described embodiment are obtained. In addition, large-sized head 124 is equivalent to a head of the disclosure according to another aspect.

INDUSTRIAL APPLICABILITY

The disclosure is applicable for a component mounting machine used for mounting components on a board.

REFERENCE SIGNS LIST

10: component mounting machine, 12: base, 14: mounting machine main body, 16: board, 18: board conveyance device, 20: supporting plate, 22: conveyor belt, 23: supporting pin, 24: head, 26: X-axis slider, 26a: driving motor, 28: guide rail, 30: Y-axis slider, 30a: driving motor, 32: guide rail, 34: Z-axis motor, 36: ball screw, 40: nozzle, 42: nozzle pressure adjusting valve, 44: vacuum pump, 45: air pipe, 46: parts camera, 48: height adjustment mechanism, 56: controller, 56a: CPU, 56b: ROM, 56c: HDD, 56d: RAM, 56e: input and output interface, 56f: bus, 60: reel unit, 62: reel, 64: feeder section, 66: device pallet, 68: height adjustment mechanism, 80: management computer, 124: large-sized head, 224: unit head

The invention claimed is:

1. A component mounting machine comprising:
   a head that holds a nozzle capable of picking up a component so as to be movable upward and downward;
   a moving device for moving the head in a horizontal direction;
   a component supply device for supplying the component;
   a board holding device for holding a board on which the component is mounted;
   an imaging device provided between the component supply device and the board holding device for irradiating the component held by the nozzle with light to image the component from below;
   a storage device for storing an imageable range of the imaging device according to a type of component;
   a setting device for obtaining a clearance height at which an obstacle between the imaging device and a predetermined mounting position on the board can be avoided, extracting the imageable range of a component to be mounted from the storage device, and setting a target height of a lower surface of the component held by the nozzle when the nozzle passes above the imaging device such that the target height is closest to the clearance height within the imageable range; and
   a control device for controlling the nozzle, the head, and the moving device such that a component supplied by the component supply device is picked up by the nozzle, an operation of lifting the nozzle such that the lower surface of the component held by the nozzle is located at the target height and an operation of moving the nozzle to the imaging device are performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the predetermined mounting position,
   wherein the component supply device includes an adjustment mechanism capable of changing a height of the component supply device, and
   wherein the control device controls the adjustment mechanism of the component supply device such that the height of the component supply device approaches the target height.

2. The component mounting machine according to claim 1,
   wherein the setting device sets a value obtained by adding a predetermined margin to a height of a component already mounted on the board as the clearance height.

3. The component mounting machine according to claim 1,
   wherein the control device changes the height of the component supply device such that the lower surface of the component held by the nozzle reaches the target height within a time during which the nozzle moves from the component supply device to the imaging device.

4. The component mounting machine according to claim 1,
wherein the height of the component supply device is set such that the component reaches the target height within a time during which the nozzle moves from the component supply device to the imaging device.

5. The component mounting machine according to claim 1,
wherein the imageable range is a range of heights in accordance with a type of component at which the imaging device can obtain a recognition image of the component, the imageable range being specified from a reference position that is related to a height of an upper surface of the board.

6. A component mounting machine comprising:
a head that holds a nozzle capable of picking up a component so as to be movable upward and downward;
a moving device for moving the head in a horizontal direction;
a component supply device for supplying the component;
a board holding device for holding a board on which the component is mounted;
an imaging device provided between the component supply device and the board holding device for irradiating the component held by the nozzle with light to image the component from below;
a storage device for storing an imageable range of the imaging device according to a type of component;
a setting device for obtaining a clearance height at which an obstacle between the imaging device and a predetermined mounting position on the board can be avoided, extracting the imageable range of a component to be mounted from the storage device, and setting a target height of a lower surface of the component held by the nozzle when the nozzle passes above the imaging device such that the target height is closest to the clearance height within the imageable range; and
a control device for controlling the nozzle, the head, and the moving device such that a component supplied by the component supply device is picked up by the nozzle, an operation of lifting the nozzle such that the lower surface of the component held by the nozzle is located at the target height and an operation of moving the nozzle to the imaging device are performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the predetermined mounting position,
wherein the imaging device includes an adjustment mechanism capable of changing a height of the imaging device, and
wherein the control device updates the target height so as to approach the clearance height in a case where the target height does not coincide with the clearance height, and controls the adjustment mechanism of the imaging device such that a distance from the target height to the imaging device after the updating falls within an imageable range.

7. The component mounting machine according to claim 6,
wherein the control device updates the target height so as to coincide with the clearance height.

8. A component mounting machine comprising:
a head that holds a nozzle capable of picking up a component so as to be movable upward and downward;
a moving device for moving the head in a horizontal direction;
a component supply device for supplying the component;
a board holding device for holding a board on which the component is mounted;
an imaging device provided between the component supply device and the board holding device for irradiating the component held by the nozzle with light to image the component from below;
a storage device for storing an imageable range of the imaging device according to a type of component;
a setting device for obtaining a clearance height at which an obstacle between the imaging device and a predetermined mounting position on the board can be avoided, extracting the imageable range of a component to be mounted from the storage device, and setting a target height of a lower surface of the component held by the nozzle when the nozzle passes above the imaging device such that the target height is closest to the clearance height within the imageable range; and
a control device for controlling the nozzle, the head, and the moving device such that a component supplied by the component supply device is picked up by the nozzle, an operation of lifting the nozzle such that the lower surface of the component held by the nozzle is located at the target height and an operation of moving the nozzle to the imaging device are performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the predetermined mounting position,
wherein the head holds multiple of the nozzles,
wherein the setting device extracts imageable ranges of respective components to be mounted from the storage device, obtains an overlapping range of all the read imageable ranges, and sets the target height so as to be closest to the clearance height within the overlapping range, and
wherein the control device controls the nozzle, the head, and the moving device such that the component supplied by the component supply device is picked by the nozzle, the operation of lifting the nozzle such that the lower surface of the component held by the nozzle is located at the target height and the operation of moving the nozzle to the imaging device are performed in parallel or sequentially, and, after the imaging using the imaging device, the nozzle is moved to the predetermined mounting position on the board such that the lower surface of the component held by the nozzle is located at the clearance height, or at the target height or the clearance height when the target height is equal to or more than the clearance height, and the component is mounted on the predetermined mounting position.

* * * * *